US007589656B2

(12) United States Patent
Aspelmayr et al.

(10) Patent No.: US 7,589,656 B2
(45) Date of Patent: Sep. 15, 2009

(54) CRANKSHAFT-SYNCHRONOUS DETECTION OF ANALOG SIGNALS

(75) Inventors: Josef Aspelmayr, Ried/Riedmark (AT); Diego Löbus, Rochester, MI (US); Richard Merl, Schwandorf (DE)

(73) Assignee: Siemens Aktiengesellschaft, Munich (DE)

( * ) Notice: Subject to any disclaimer, the term of this patent is extended or adjusted under 35 U.S.C. 154(b) by 282 days.

(21) Appl. No.: 11/629,933

(22) PCT Filed: Jun. 15, 2005

(86) PCT No.: PCT/EP2005/052771

§ 371 (c)(1),
(2), (4) Date: Dec. 18, 2006

(87) PCT Pub. No.: WO2005/124134

PCT Pub. Date: Dec. 29, 2005

(65) Prior Publication Data

US 2008/0027619 A1 Jan. 31, 2008

(30) Foreign Application Priority Data

Jun. 16, 2004 (DE) ....................... 10 2004 029 065

(51) Int. Cl.
*H03M 1/12* (2006.01)

(52) U.S. Cl. ...................................... 341/155; 701/115

(58) Field of Classification Search ................. 341/155; 701/115, 102, 114, 123; 702/151; 73/114.26, 73/514.32; 123/634
See application file for complete search history.

(56) References Cited

U.S. PATENT DOCUMENTS

| | | | |
|---|---|---|---|
| 4,197,643 | A | 4/1980 | Burstone et al. |
| 4,443,193 | A | 4/1984 | Roane |
| 4,670,024 | A | 6/1987 | Bhat et al. |
| 4,776,863 | A | 10/1988 | van den Berg et al. |
| 4,814,294 | A | 3/1989 | West et al. |
| 4,820,547 | A | 4/1989 | Lindsay et al. |
| 4,859,493 | A | 8/1989 | Lemelson |
| 4,892,479 | A | 1/1990 | McKenna |
| 4,952,236 | A | 8/1990 | Wang et al. |

(Continued)

FOREIGN PATENT DOCUMENTS

DE 43 13 331 A1 10/1994

(Continued)

*Primary Examiner*—Rexford N Barnie
*Assistant Examiner*—Joseph Lauture
(74) *Attorney, Agent, or Firm*—Laurence A. Greenberg; Werner H. Stemer; Ralph E. Locher

(57) ABSTRACT

Synchronization of the angle position of the crankshaft of a motor vehicle with the internal clock of a engine control device is often imprecise and complicated and is often fraught with difficulties, particularly with regard to the detection and processing of external sensor signals. The invention relates to a engine control device wherein the angle position of the crankshaft is initially detected and converted into an electronic trigger signal in a trigger converter. The electronic trigger signal controls the detection and the analog-to-digital conversion of an analog signal, particularly an analog sensor signal. Control occurs in such a way that data can only be detected when a specific trigger signal is present or that data can only be continuously detected and processed when a specific trigger signal is present.

17 Claims, 4 Drawing Sheets

U.S. PATENT DOCUMENTS

| | | | |
|---|---|---|---|
| 4,984,940 | A | 1/1991 | Bryant et al. |
| 4,997,686 | A | 3/1991 | Feldstein et al. |
| 5,037,516 | A | 8/1991 | Buck |
| 5,145,517 | A | 9/1992 | Feldstein et al. |
| 5,156,807 | A | 10/1992 | Nagata et al. |
| 5,232,361 | A | 8/1993 | Sachdeva et al. |
| 5,264,055 | A | 11/1993 | Champin et al. |
| 5,299,937 | A | 4/1994 | Gow |
| 5,300,330 | A | 4/1994 | Feldstein et al. |
| 5,358,586 | A | 10/1994 | Schutz et al. |
| 5,380,200 | A | 1/1995 | Heath et al. |
| 5,464,362 | A | 11/1995 | Heath et al. |
| 5,545,490 | A | 8/1996 | Oshika |
| 5,725,573 | A | 3/1998 | Dearnaley et al. |
| 5,839,275 | A | 11/1998 | Hirota et al. |
| 5,863,616 | A | 1/1999 | Feldstein et al. |
| 5,947,723 | A | 9/1999 | Mottate et al. |
| 5,984,679 | A | 11/1999 | Farzin-Nia et al. |
| 6,132,209 | A | 10/2000 | Devanathan |
| 6,144,914 | A | 11/2000 | Davis et al. |
| 6,149,501 | A | 11/2000 | Farzin-Nia et al. |
| 6,258,182 | B1 | 7/2001 | Schetky et al. |
| 6,306,466 | B1 | 10/2001 | Feldstein et al. |
| 6,315,558 | B1 | 11/2001 | Farzin-Nia et al. |
| 6,711,472 | B2 | 3/2004 | Mencher et al. |
| 6,757,608 | B2 | 6/2004 | Gross et al. |
| 6,999,869 | B1 * | 2/2006 | Gitlin et al. ................. 701/115 |
| 7,137,815 | B2 | 11/2006 | Matsutani et al. |
| 2002/0137008 | A1 | 9/2002 | McSpadden et al. |
| 2003/0199236 | A1 | 10/2003 | Aloise et al. |
| 2004/0084036 | A1 * | 5/2004 | Porter et al. ................ 123/634 |
| 2004/0171333 | A1 | 9/2004 | Aloise et al. |
| 2004/0255674 | A1 * | 12/2004 | Steiger et al. ............ 73/514.32 |
| 2005/0003325 | A1 | 1/2005 | Matsutani et al. |
| 2006/0115786 | A1 | 6/2006 | Matsutani et al. |

FOREIGN PATENT DOCUMENTS

| | | | |
|---|---|---|---|
| DE | 199 33 664 | A1 | 1/2001 |
| DE | 100 48 780 | A1 | 4/2002 |
| DE | 100 48 808 | A1 | 4/2002 |
| EP | 0831226 | A2 | 3/1998 |
| GB | 1 331 060 | | 9/1973 |
| JP | 1-116270 | | 9/1989 |
| JP | 10061466 | A | 3/1998 |
| JP | 10061476 | A | 3/1998 |

* cited by examiner

CRANKSHAFT-SYNCHRONOUS DETECTION OF ANALOG SIGNALS

BACKGROUND OF THE INVENTION

Field of the Invention

The invention relates to a method and device for picking up analog signals, in particular analog sensor signals, related to an angle signal, in particular the angle signal of a crankshaft in internal combustion engines. Such devices and methods primarily serve to pick up analog measured values in engine control units or ECUs.

The operation of modern internal combustion engines in automotive engineering is inconceivable without the deployment of high-performance computer systems. The increasingly restrictive requirements relating to pollutant emissions in the form of corresponding statutory provisions in particular mean that sophisticated computer and control engineering has to be used to adjust the combustion mixture and ignition point precisely. It is thereby necessary to process a large number of sensor signals in particular, such as the signals from oxygen or temperature sensors for example, in real time.

These tasks are essentially dealt with by the engine control unit (ECU), the high-performance computer system on board a vehicle. As well as one or more microprocessors (generally what are known as embedded systems), a number of further electronic components, such as analog/digital converters (AD converters) or electronic filter modules, are integrated in the corresponding housing of an engine control unit. The engine control unit uses the numerous sensor signals (with the aid of what are known as lookup tables for example) to calculate the corresponding control signals and adjustment parameters, such as the optimum ignition point or the optimum fuel injection duration.

Temporal synchronization of measurement plays a significant role, in particular when detecting analog measured values (for example the measured values from pressure, temperature or oxygen sensors). Even simple computer systems contain internal clock systems, which can in principle be used for temporal detection and synchronization of the detection of measured values. However it should be noted that the measured values typically have to be detected in each instance in relation to a defined operating state of the engine. The angle position of the crankshaft in particular has proven to be an indicator of the operating state of an engine.

Depending on the type of combustion engine, the angle position of the crankshaft defines the position of the pistons in each individual cylinder in a precise manner. Thus for example a complete cycle of a typical four-cylinder internal combustion engine comprises two complete rotations of the crankshaft, in other words angles from 0° to 720°. After two rotations (720°) each cylinder in the engine has gone through its cycle once. The cylinders thereby operate in a sequential manner, in other words each cylinder only operates within a specific segment within a complete cycle. A range of angle positions of the crankshaft thereby corresponds to each segment, given by the overall angle range (for example 720°) divided by the number of cylinders. Thus a segment of a four-cylinder combustion engine comprises an angle range of 180°. The first segment therefore corresponds to angle positions from 0° to 180°, the second to angle positions from 180° to 360°, etc.

The angle position of the crankshaft is typically detected by means of what is known as a sensor disk on the crankshaft. This sensor disk is generally a metal toothed disk, the rotation of which is generally detected by means of an inductive sensor. Typical sensor disks for four-cylinder engines have 60 teeth for example (or 58 after deducting the two "gaps", corresponding to a total of 120 teeth for a complete 720° degree cycle, in other words one tooth per 6° angle position. As a tooth of the sensor disk approaches an induction coil of the sensor, the magnetic field in the coil changes, causing a current to be induced in the coil. The frequency of this temporally changing current is a measure of the rotation speed of the crankshaft. Other types of sensor, for example optical or magnetic sensors, can also be used in principle.

In order also to be able to conclude an absolute position of the crankshaft from the periodic rotation speed measuring signal, gaps are generally incorporated in the teeth of the sensor disk, the gaps generally representing two teeth. It is thus possible to determine the position of the crankshaft accurately and thus an important parameter of the operating state of the internal combustion engine on the basis of the signal.

In conventional engine control units the angle position of the crankshaft or the rotation speed is synchronized at regular time intervals with the internal clock of the engine control unit. The detection of sensor signals and the subsequent calculation or generation of corresponding parameters and control signals therefore take place as a function of the internal clock of the engine control unit.

These calculations take a long time however and represent a significant load on the processor due to computation output and storage outlay. The angle position of the crankshaft must first be detected at a specific engine rotation speed and then be synchronized with the internal clock of the engine control unit. Measurement data from the different sensors is then detected in relation to the internal clock of the engine control unit.

Until now measurement data has generally been detected at a fixed scan rate, with scan rates between 5 and 10 microseconds being typical. So a new analog value of a specific sensor signal is detected every 10 microseconds for example. At a rotation speed of 1000 rpm in a four-cylinder engine, in other words a cycle time (time required for a 720° rotation) of 120 milliseconds and therefore a segment time of 30 milliseconds, this corresponds to 3000 analog measured values per sensor, cylinder and segment. At low rotation speeds the number of measured values per sensor, cylinder and segment increases correspondingly. Thus for example at 500 rpm 6000 analog measured values are detected per sensor, cylinder and segment. This represents an enormous storage load for the engine control unit.

It is in principle possible to adapt the scan rate for measurement signal detection to the speed of the engine. The limited options for configuring existing AD converters in embedded microcontrollers however restrict such possibilities significantly.

This measurement data is then used to calculate optimum control signals, which however in turn for example have to be output at precisely defined angle positions of the crankshaft (for example as calculated by the engine control unit). To this end the optimum times therefore have to be calculated in the time base of the engine control unit and then in turn be converted to corresponding angle positions. This complex calculation and generation of control signals represents an extreme load on the microprocessor of the ECU, which typically only has a clock frequency of 40 MHz and a storage capacity of 256 kilobytes.

SUMMARY OF THE INVENTION

The object of the invention is therefore to specify a method and device, which improve the detection and processing of analog measurement data in engine control units.

This object is achieved by the invention with the features of the independent claims. Advantageous developments of the invention are characterized in the subclaims.

An engine control unit is proposed, having means to detect an angle position of a crankshaft and means to convert the angle position of the crankshaft to an electronic trigger signal. The engine control unit should further have means to detect at least one analog signal, in particular an analog sensor signal, including at least one signal input for analog signals, at least one analog/digital converter to convert the at least one analog signal to at least one digital signal and at least one control facility. This control facility should be able to activate or deactivate and/or start or terminate detection of the at least one analog signal, as a function of the electronic trigger signal.

The term "detection" here should be interpreted broadly. It can for example relate to measuring, buffering (sampling), converting from analog to digital, storing or a combination of such processes (in some instances with further signal modification). Alternatively there can be permanent analog/digital conversion with only the storage of the converted data being understood as "detection". "Means to detect" can correspondingly refer for example to a corresponding sensor, an analog/digital converter, a corresponding signal conversion or buffering or even just some of said devices.

The control facility can for example be a trigger input, which can in particular interact with means to generate a trigger signal, for example a trigger converter.

An engine control unit refers to a system for controlling an internal combustion engine. It does not necessarily have to be a physical and/or electronic unit but can in particular be a linking of interacting but spatially separated components. The means to convert the angle position of the crankshaft to an electronic trigger signal and the means to detect the at least one analog signal in particular can be integrated wholly or partially in an integrated electronic circuit, in particular what is known as an application-specific integrated circuit (ASIC).

The digital electronic trigger signal can in particular be a periodic, for example rectangular, signal, for example a TTL signal. Thus a period of this signal can in particular correspond to a period on the sensor disk, in other words the interval between two teeth on the sensor disk (see above) or the resulting angular rotation of the crankshaft. In the above example of the four-cylinder engine with a sensor disk with 60 teeth a period therefore corresponds to an angular rotation of 60°.

Since, as described above, there are generally one or more teeth missing from the sensor disk, it is also possible to conclude an absolute angle position of the crankshaft from the corresponding gaps in the trigger signal.

The trigger signal can also be modified correspondingly. Signal level adjustment, frequency filtering, frequency multiplication and/or phase displacement has/have thereby proven particularly advantageous. Frequency filtering may for example be necessary to eliminate higher-frequency or low-frequency interference signals (vibration, harmonics, etc.). Frequency multiplication refers to a modification of a periodic signal, such that the frequency of the signal is multiplied by a multiplier (typically a rational, in particular a natural number between 0 and 1 or greater than 1).

It is also possible to convert the trigger signal to a new trigger signal by means of a predetermined function. Thus for example a predetermined (for example predetermined by a computer program) number of periods is selected from the original trigger signal by means of a counting device, during which periods the new trigger signal assumes the value "high". It is thus possible to generate a trigger signal, which only assumes the value "high" in quite specific angle positions of the crankshaft. Or the signal "high" can be output from a specific angle position for a permanently predefined time period.

In particular the modification of the trigger signal can be adapted to the rotation speed of the crankshaft. Thus for example a frequency multiplication of a periodic trigger signal with frequency F can take place, such that the frequency F of the new trigger signal increases less than in proportion to the rotation speed D. In other words the quotient of frequency F and rotation speed D decreases as the rotation speed D increases. This decrease does not have to be continuous but can for example also take place in discrete stages. When the detection of analog measurement data is controlled with this new trigger signal (see below), this tailored adaptation of frequency multiplication can be used to ensure that the load on the storage and/or computation capacity of the engine control unit per unit of time remains constant over the entire rotation speed range. The trigger signal can be adapted to the rotation speed during ongoing operation of the engine control unit.

Conversion of the angle position of the crankshaft to a corresponding trigger signal according to one of the described methods can in particular also be purely hardware-based, in other words without using computation algorithms in separate electronic modules. This avoids the use of a microprocessor and any additional load on the processor capacity of an existing processor (see below) due to the formation of the trigger signal.

The at least one analog signal can in particular be an analog signal of a sensor, for example an oxygen, temperature or pressure sensor, and the detection of a number of analog signals, in particular the signals from a number of sensors, is also possible. In this instance it is possible in particular to use one or more switches, which can switch detection between the individual analog signals. This means that the signals of a number of sensors can be detected consecutively or alternatively or in parallel. Switching between detection of the individual signals can in particular be controlled by a microcomputer, such that the analog signals of predetermined sensors are detected respectively at predetermined times. Switching can in particular also be controlled by the electronic trigger signal (which can expediently also comprise a number of correlated individual signals).

In addition to the analog/digital converter the means to detect the at least one analog signal can also have a data processing device (in particular a microprocessor) as well as means to adapt or modify the analog signals, in particular means for frequency filtering. The microcomputer can for example be the computation unit (for example a CPU with a storage unit) of a commercial integrated engine control circuit.

The control facility can in particular be a trigger input of the analog/digital converter or a trigger input of the data processing device. This trigger input is connected to the means to convert the angle position of the crankshaft to an electronic trigger signal. It does not necessarily have to be a physical electronic connection but a wireless connection (e.g.

infrared data transmission) for example is also possible. The trigger signal described above and generated from the angle position or a trigger signal derived therefrom is used in this manner to control detection of the analog signals.

The digitized signals can then be further processed using the data processing device. Thus corresponding control signals for the engine controller can be generated for example from a number of sensor signals with the aid of stored functions and parameters and output.

The described engine control unit with the data pick-up triggered in a crankshaft-synchronous manner has the decisive advantage, compared with conventional engine control units as described above with a constant or predetermined scan rate, that detection of the at least one analog signal does not take place at permanently predetermined times at permanently predetermined repetition rates (scan rates). Too great a load on the computation and storage capacities of the engine control unit is thereby prevented, particularly at low rotation speeds. Rather the analog signals are detected as a function of the actual angle position of the crankshaft and therefore the actual operating state of the internal combustion engine. Thus for example specific sensor signals (for example the signal of a pressure sensor in cylinder 2 of a four-cylinder engine) are only detected at times which are actually of interest (therefore for example only in segment 2, in which the $2^{nd}$ cylinder operates, in other words in the crankshaft angle range between 180° and 360°).

Data of no interest, in other words analog signals in angle positions of the crankshaft, which are not of interest in respect of a specific sensor for example, is therefore not detected from the outset, thereby reducing the storage and processor load significantly.

It is not necessary to convert the angle position of the crankshaft or the rotation speed to an internal time system of the engine control unit, said process taking up a great deal of processor capacity and storage. Only hardware is necessary to generate the trigger signals; there is no software outlay. The load on the processor is thereby reduced. Nor is there a constant high load at low speeds.

The accuracy of the system is also significantly increased by crankshaft-synchronous measurement data detection. The measurement data can be detected at permanently predetermined angle positions, which is considerably more precise than time-controlled detection with subsequent interpolation sometimes being required.

To prevent the described advantages turning into the opposite (namely too great a load on the engine control unit at high rotation speeds), it is also possible to adapt the scan rate or reduce the measurement data as the rotation speed increases, as described above, by corresponding adaptation of the trigger signal to the rotation speed. This allows a regular quantity of data and processor loading to be achieved over the entire rotation speed range.

To reduce the load on the storage unit and processor of the data processing device further, raw data can already be pre-processed in the analog/digital converter, which converts the analog signals of one or more sensors for example to digital signals. Such pre-processing can in particular include frequency filtering and/or a statistical analysis of the analog or already digitized data. For example a mean value can be formed for the data over a specific time period or over a specific number of measured values. Such pre-processing significantly reduces the quantity of data that is transferred for example from the analog/digital converter to the microprocessor.

Crankshaft-synchronous triggering of detection of the analog data according to one of the methods described above again offers an essential advantage even during pre-processing of the detected data. Since the trigger signal, which triggers the picking up of the analog data, contains information about the angle position and rotation speed of the crankshaft, the analog or digital signal can for example be average directly over a specific angle range of the crankshaft. It is no longer necessary to convert the angle positions to time signals.

Rotation speed-dependent pre-processing of the data is also possible, for example by displacing the time or angle position range, over which an analog or digital signal is averaged, as a function of the rotation speed. Thus for example the ignition point can be highly dependent on the rotation speed. It can be of interest here to detect for example the pressure in a specific cylinder respectively as an average in a specific angle range in relation to the ignition point. This is again possible without any problem by means of crankshaft-synchronous triggering of signal detection, without using computation capacity of the microprocessor and without converting the trigger signal to a time signal.

During pre-processing of the detected signals it is also possible for example to adapt a predetermined approximation function to the detected data. Only the approximation function or the parameters characterizing the approximation function is/are then forwarded correspondingly from the analog/digital converter to the data processing device for data processing purposes, instead of the data. Information about the angle position or rotation speed of the crankshaft can thereby play a role, for example as one of the parameters of the approximation function. This type of signal pre-processing also contributes significantly to the reduction in the processor and storage capacity requirement.

A further advantage of the described engine control unit is the fact that the device can be implemented with existing microprocessors and electronic components. Both microprocessors with trigger input for engine control units and analog/digital converters with trigger input are available commercially. No expensive and time-consuming development of such components is required.

A method is also proposed for the crankshaft-synchronous detection of analog signals, in particular analog sensor signals, wherein the angle position of a crankshaft is detected first. The detected angle position of the crankshaft is converted to at least one electronic trigger signal. At least one analog signal, in particular an analog sensor signal, is also detected. The at least one analog signal is thereby converted to at least one digital signal. The detection and/or analog/digital conversion of the at least one analog signal is controlled by means of the trigger signal.

The detection and/or analog/digital conversion of the at least one analog signal is/are advantageously controlled using one of the following principles or a combination of said principles:

Detection and/or analog/digital conversion is/are initiated when the trigger signal reaches, exceeds or drops below a predetermined level.

Detection and/or analog/digital conversion is/are allowed, as long as the trigger signal at least reaches and/or exceeds a predetermined signal level, with detection and/or analog/digital conversion otherwise being prevented.

Detection and/or analog/digital conversion is/are allowed, as long as the trigger signal is below and/or does not exceed a predetermined signal level, with detection and/or analog/digital conversion otherwise being prevented.

Detection and/or analog/digital conversion is/are allowed in the case of a periodic trigger signal during a predetermined number of periods and otherwise prevented.

Detection and/or analog/digital conversion is/are allowed from a predetermined trigger signal, in particular from a time when the trigger signal reaches, exceeds or drops below a predetermined level, during a permanently predetermined time period and otherwise prevented.

The level of the at least one analog signal can also be modified and/or frequency filtering of the at least one analog signal can be carried out. Also at least one control signal can be calculated from the at least one digital signal by means of a data processing algorithm, to regulate an internal combustion engine.

The at least one electronic trigger signal can advantageously undergo frequency multiplication with a predetermined multiplier and/or undergo phase displacement by a predetermined phase and/or at least one second electronic trigger signal can be generated from the at least one electronic trigger signal, with the second electronic trigger signal being a function with changeable parameters of the first electronic trigger signal.

Generation of the at least one electronic trigger signal can in particular be a function of the crankshaft rotation speed. In this process, if the electronic trigger signal is periodic with a frequency F or approximately periodic or at least approximately periodic within a time period under consideration, its frequency F is advantageously multiplied, as the rotation speed increases, such that the relationship between the frequency F and the rotation speed D decreases as the rotation speed D increases.

BRIEF DESCRIPTION OF THE DRAWINGS

The invention is described in more detail below with reference to exemplary embodiments shown schematically in the figures. The invention is however not limited to the examples. The same reference characters in the individual figures thereby relate to identical elements or elements of identical function or elements with corresponding functions.

DESCRIPTION OF THE PREFERRED EMBODIMENTS

Figure 1:
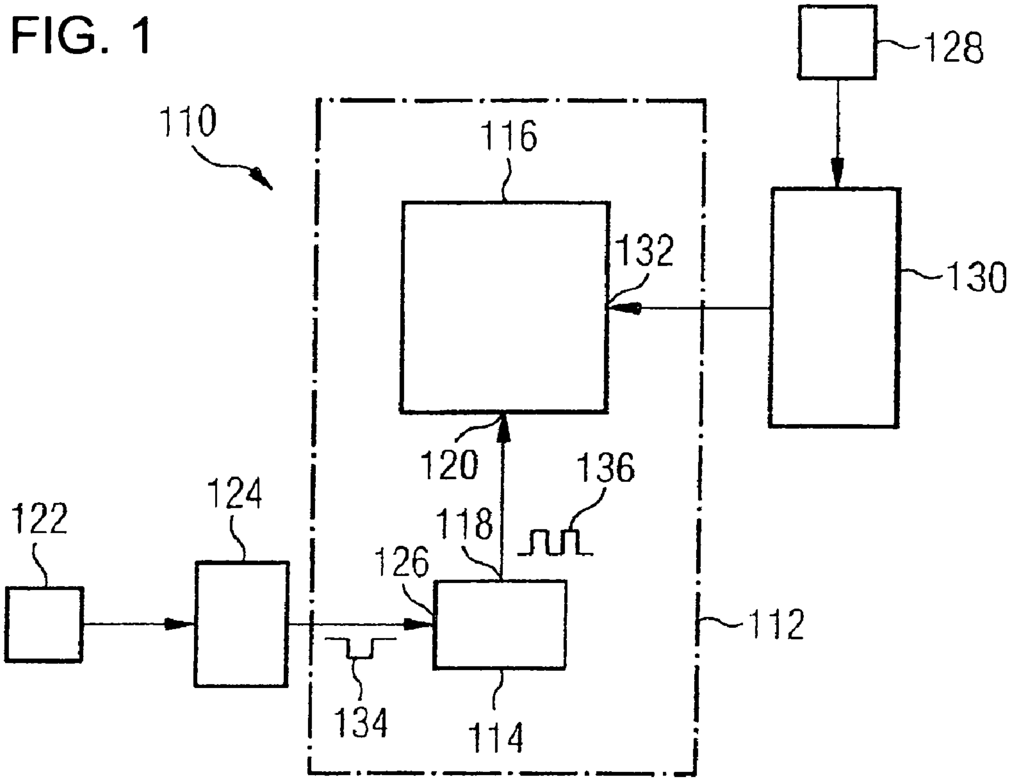
FIG. 1 shows a first embodiment of an engine control unit with a microcomputer triggered in a crankshaft-synchronous manner to detect measurement data.

The core element of the engine control unit 110 in FIG. 1 is an integrated circuit (ASIC) 112, which comprises a trigger converter 114 and a fast AD converter FADC 116. In the example shown the ASIC 112 is a controller of the Infineon TC17XX family. A signal output 118 of the trigger converter 114 is connected to a trigger input 120 of the FADC 116.

A crankshaft sensor 122 is connected by way of a crankshaft AD converter 124 to a signal input 126 of the trigger converter 114. A temperature sensor 128 is connected by way of a filter/amplifier unit 130 to a signal input 132 of the FADC 116.

Figure 2:
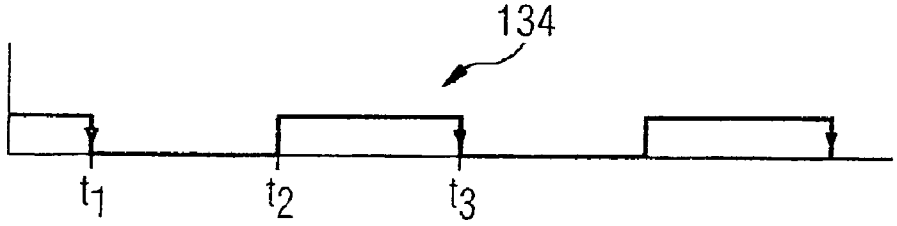
FIG. 2 shows a pattern of a crankshaft signal.
Figure 3:
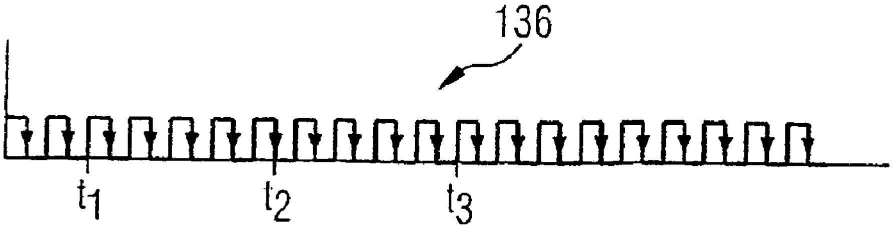
FIG. 3 shows a pattern of a trigger signal.

The crankshaft signal 134 exchanged between the crankshaft AD converter 124 and the trigger converter 112 is shown in FIG. 2 to explain the interaction of the individual components of the engine control unit 110 in FIG. 1. The trigger signal 136 exchanged between the trigger converter 112 and the FADC 116 is correspondingly shown in FIG. 3.

The crankshaft sensor 122 first detects a signal from the crankshaft, as described above, in this example an analog sinusoidal signal (not shown) from a magnetic sensor, which detects the position of the teeth on the toothed disk described above. This analog sinusoidal signal is converted to the crankshaft signal 134 shown in FIG. 2 in the crankshaft AD converter 124. This is a rectangular signal, which is respectively at level "low" (in this instance the zero line) for a time period t1 to t2 and then at the TTL level "high" (5 volts) for a time period from t2 to t3. The signal thus has a period t3−t1 and a frequency of 1/(t3−t1).

The crankshaft signal 134 is frequency-multiplied by a factor nine in the trigger converter 114 in this simple example. Correspondingly the trigger converter 114 generates a rectangular signal with the frequency 9×1/(t3−t1) as a trigger signal 136 from the crankshaft signal 134. The signal levels are left unchanged in this example. The trigger converter 114 starts the conversion respectively at time t1, in other words with a falling edge of the crankshaft signal 134, and generates a rising edge of the trigger signal 136. The trigger signal 136 is correspondingly phase-displaced by 180° compared with the crankshaft signal 134.

This trigger signal 136 is routed to the FADC 116 by way of the signal input 120. The trigger input 120 is configured such that the FADC 116 only accepts signals at its signal input 132, when the trigger signal 136 exceeds a predetermined level. The rest of the time the FADC 116 "ignores" signals at its signal input 132.

Figure 4:
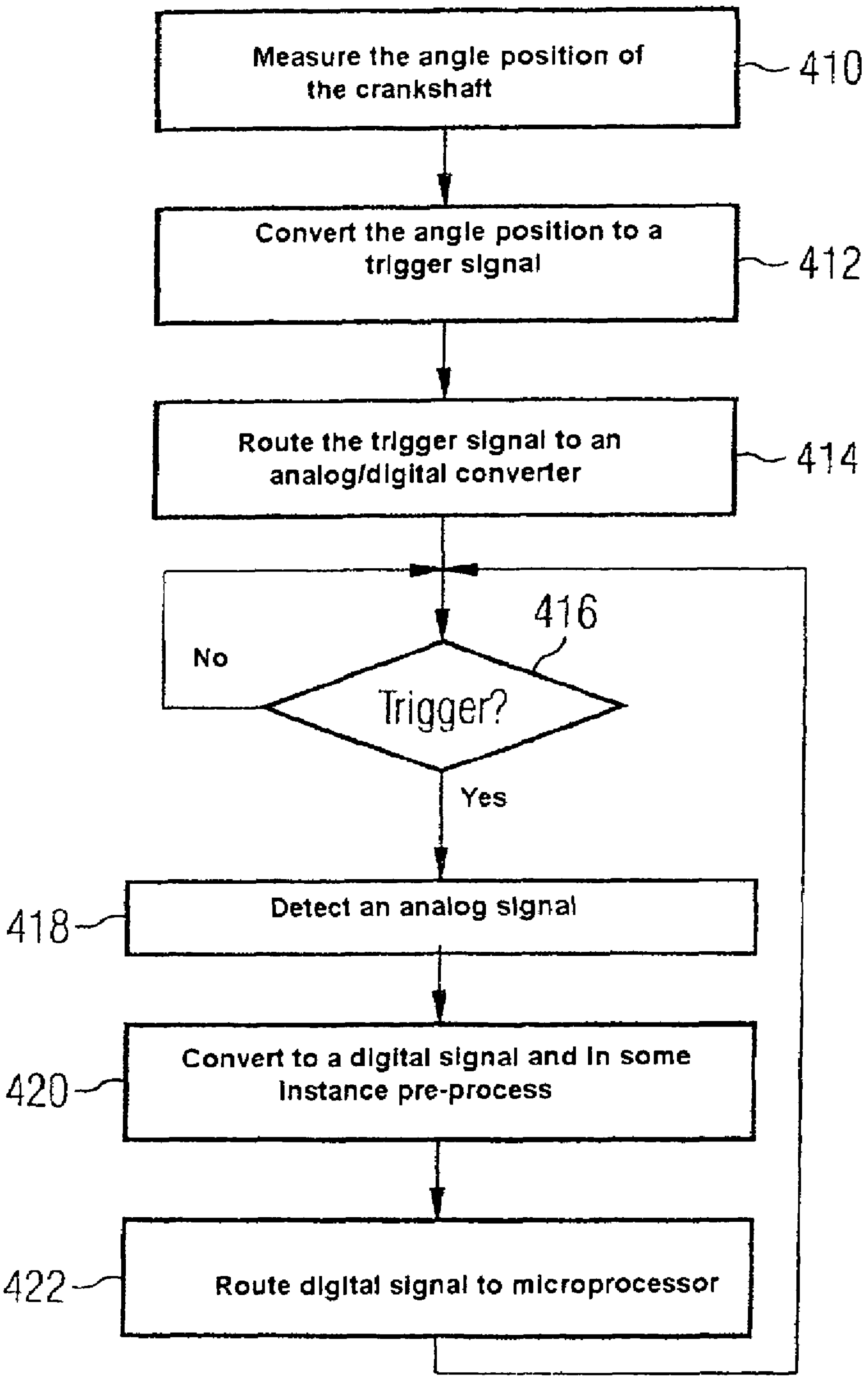
FIG. 4 shows a flow diagram of a first exemplary embodiment of a method for crankshaft-synchronous measurement data detection.

The method shown in FIG. 4 for example can be implemented using the configuration described in FIG. 1. In step 410, as described above, the crankshaft signal is detected first, digitized in the crankshaft AD converter 124 and then converted in the trigger converter 112 in step 412 to the trigger signal 136. This is then routed in step 414 to an analog/digital converter, in this instance specifically the FADC 116. The FADC 116 queries in step 416 whether the trigger signal exceeds a predetermined value. This interrogation can take place in a permanent loop. Only if this is the case, is an analog signal, which in the example shown in FIG. 1, is routed from the filter/amplifier unit 130 to the FADC 116, detected in step 418 and converted in step 420 to a digital signal. It is also possible for complete or partial pre-processing of the signal (see above) to take place in this step. This digital signal is then in turn routed in step 422 for further processing to a microprocessor (not shown in FIG. 1), which can generate control signals for example for engine control purposes from said signal according to its programmed algorithms.

Figure 5:
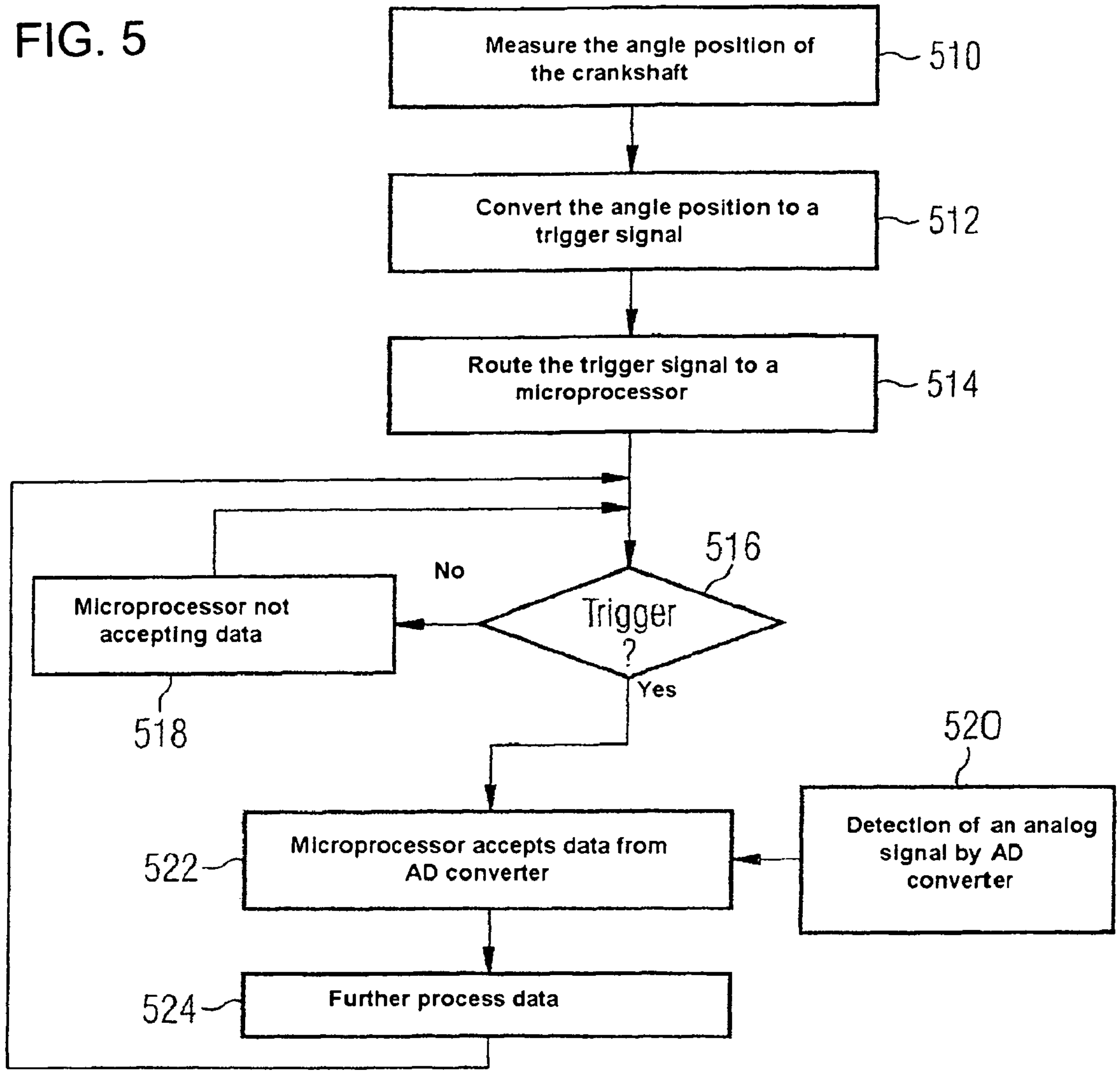
FIG. 5 shows a flow diagram of a second exemplary embodiment of a method crankshaft-synchronous measurement data detection.

FIG. 5 shows a similar method, wherein the trigger signal 136 is used not to trigger an AD converter but to trigger the data pick-up by a microprocessor. This microprocessor, which is part of practically every engine control unit, is not shown in FIG. 1. It can be a further part of the ASIC 112.

As in FIG. 4, in step 510 the angle position of the crankshaft is first detected and converted to a trigger signal in step 512.

This trigger signal is then routed to a microprocessor in step 514 rather than directly to an AD converter. In step 516 said microprocessor interrogates the trigger signal and accepts no data from the AD converter, while said trigger signal does not exceed a predetermined level (step 518). Independently of this, in step 520, an AD converter continuously detects analog measurement data from one or more sensors, carries out pre-processing in some instances, converts the analog signals to digital signals and supplies the converted signals to the microprocessor. Not until the interrogation in step 516 establishes an adequate trigger level does the microprocessor accept said data in step 522 and process it further in step 524.

Figure 6:
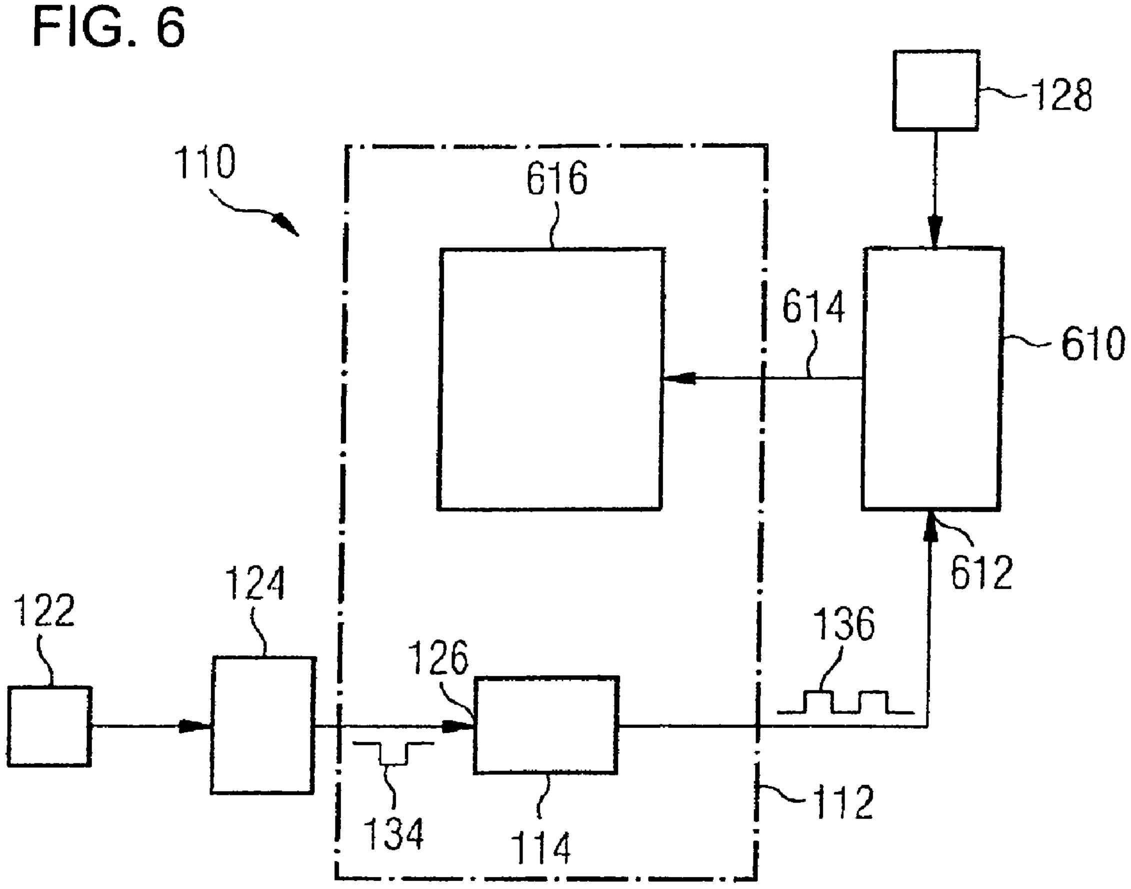
FIG. 6 shows a second embodiment of an engine control unit with an external AD converter for measurement data detection that is triggered in a crankshaft-synchronous manner.

FIG. 6 shows an alternative configuration of an engine control unit 110 to FIG. 1, wherein the crankshaft-synchronous trigger signal 136 is not used to trigger an internal FADC 116 but to trigger an external AD converter 610. The essential difference in the configuration in FIG. 6 is that the signal output 118 of the trigger converter 114 is connected to a trigger input 612 of the external AD converter 610. This in turn is connected by way of an interface 614 to a microprocessor 616 integrated in the ASIC 112.

The mode of operation of the configuration shown in FIG. 6 corresponds to the configuration in FIG. 1. The AD conversion of the analog signal generated by the sensor 128 does not however take place in the ASIC 112 but by means of the external electronic component 610. Pre-processing of the analog or already digitized data can also take place in the external AD converter 610, such that the data transferred to the microprocessor 616 by way of the interface 614 can already be reduced to an absolute minimum. This reduces the load on the microprocessor 610 further. As the external AD converter 610 is easily accessible, it is also simple to replace and exchange for example when more up to date components are available.

The method shown in FIG. 4 and described above can also be used with the arrangement shown in FIG. 6. In this instance the trigger signal 136 is routed to an AD converter in step 414 by way of an external line connection.

We claim:

1. An engine control unit, comprising:

a) a detector device for detecting an angle position of a crankshaft;

b) a converter device connected to said detector device and configured to convert the angle position of the crankshaft to an electronic trigger signal; and c) a detector device for detecting at least one analog signal, said detector device having;

c1) at least one signal input for receiving analog signals;

c2) at least one analog/digital converter for converting the at least one analog signal to at least one digital signal; and c3) at least one control device, configured to initiate said analog digital converter, in dependence upon the electronic trigger signal, for detecting the analog signal and for converting to a digital signal, such that crankshaft-synchronous recording of data occurs.

2. The engine control unit according to claim 1, wherein said detector device is configured to detect an analog sensor signal.

3. The engine control unit according to claim 1, wherein said detector device further includes at least one of the following components:

c4) a data processing device; and/or c5) means for adapting or modifying a signal level of the at least one analog signal; and/or c6) a filter for frequency filtering the at least one analog signal.

4. The engine control unit according to claim 3, wherein said data processing device is a microprocessor.

5. The engine control unit according to claim 3, wherein said control device has a trigger input connected to said data processing device.

6. The engine control unit according to claim 1, wherein said analog/digital converter includes at least one of the following means for pre-processing the digital signals:

c21) means for statistical analysis of the digital signals; and/or c22) means to form a temporal mean value; and/or c23) means to adapt and supply an analytical approximation function to the digital signals.

7. The engine control unit according to claim 1, wherein said converter device for converting the angle position of the crankshaft to an electronic trigger signal includes one or more of the following components:

b1) means for adapting or modifying a signal level; and/or b2) means for frequency multiplication and/or phase displacement of a periodic signal; and/or b3) means for frequency filtering of a periodic signal; and/or b4) a counting device for counting periods or sub-periods of a periodic signal; and/or b5) means to select predetermined periods of a periodic signal.

8. The engine control unit according to claim 1, wherein said control device has a trigger input connected to said analog/digital converter.

9. The engine control unit according to claim 1, wherein the following components are wholly or partially integrated in an integrated electronic circuit:

said converter device for converting the angle position of the crankshaft to an electronic trigger signal; and said detector device for detecting the at least one analog signal.

10. A method for crankshaft-synchronous detection of analog signals, the method which comprises:

a) detecting an angle position of a crankshaft;

b) converting the angle position of the crankshaft to at least one electronic trigger signal;

c) detecting at least one analog signal; and thereby c1) converting the at least one analog signal to at least one digital signal; and c2) controlling a detection and/or analog/digital conversion of the at least one analog signal with the trigger signal generated in step b), such that a crankshaft-synchronously triggered data recording occurs.

11. The method according to claim 10, wherein the analog signal is an analog sensor signals.

12. The method according to claim 10, wherein the method step c2) has one or more of the following sub-steps:

c21) initiating detection and/or analog/digital conversion when the trigger signal (136) reaches, exceeds or drops below a predetermined level; and/or c22) allowing detection and/or analog/digital conversion as long as the trigger signal at least reaches and/or exceeds a predetermined signal level, and otherwise preventing detection and/or analog/digital conversion; and/or c23) allowing detection and/or analog/digital conversion as long as the trigger signal is below and/or does not exceed a predetermined signal level, and otherwise preventing detection and/or analog/digital conversion; and/or c24) allowing detection and/or analog/digital conversion in the case of a periodic trigger signal during a predetermined number of periods and otherwise preventing the detection and/or analog/digital conversion; and/or c25) allowing detection and/or analog/digital conversion from a predetermined trigger signal during a permanently predetermined time period, and otherwise preventing the detection and/or analog/digital conversion.

13. The method according to claim 12, wherein step c25 comprising allowing detection and/or analog/digital conversion from a time when the trigger signal reaches, exceeds or drops below a predetermined level.

14. The method according to claim 12, wherein method step c) further includes one or more of the following sub-steps:

c3) modifying a level of the at least one analog signal; and/or c4) carrying out frequency filtering of the at least one analog signal; and/or c5) calculating at least one control signal from the at least one digital signal by way of a data processing algorithm, to regulate an internal combustion engine.

15. The method according to claim 10, wherein method step b) includes one or more of the following sub-steps:

b1) frequency-multiplying the at least one electronic trigger signal by a predetermined multiplier; and/or b2) phase-displacing the at least one electronic trigger signal by a predetermined phase; and/or b3) generating at least one second electronic trigger signal from the at least one electronic trigger signal, wherein the second electronic trigger signal is a function with changeable parameters of the first electronic trigger signal.

16. The method according to claim 10, wherein generation of the at least one electronic trigger signal in step b) is a function of a rotation speed of the crankshaft.

17. The method according to claim 10, wherein the electronic trigger signal is periodic with a frequency F, and the method comprises decreasing a ratio of the frequency F and the rotation speed D as the rotation speed D increases.

* * * * *